United States Patent
Lauffer et al.

(10) Patent No.: US 12,359,319 B2
(45) Date of Patent: Jul. 15, 2025

(54) ARRANGEMENT FOR MEASURING THE SURFACE TEMPERATURE OF A SUSCEPTOR IN A CVD REACTOR

(71) Applicant: AIXTRON SE, Herzogenrath (DE)

(72) Inventors: Peter Sebald Lauffer, Aachen (DE); Francisco Ruda Y Witt, Eschweiler (DE)

(73) Assignee: AIXTRON SE, Herzogenrath (DE)

( * ) Notice: Subject to any disclaimer, the term of this patent is extended or adjusted under 35 U.S.C. 154(b) by 835 days.

(21) Appl. No.: 17/250,221

(22) PCT Filed: Jun. 14, 2019

(86) PCT No.: PCT/EP2019/065721
§ 371 (c)(1),
(2) Date: Dec. 17, 2020

(87) PCT Pub. No.: WO2019/243196
PCT Pub. Date: Dec. 26, 2019

(65) Prior Publication Data
US 2021/0262087 A1  Aug. 26, 2021

(30) Foreign Application Priority Data

Jun. 19, 2018  (DE) ..................... 10 2018 114 706.6
May 28, 2019  (DE) ..................... 10 2019 114 249.0

(51) Int. Cl.
*C23C 16/458* (2006.01)
*C23C 16/46* (2006.01)
*C23C 16/52* (2006.01)

(52) U.S. Cl.
CPC ...... *C23C 16/4586* (2013.01); *C23C 16/4584* (2013.01); *C23C 16/46* (2013.01); *C23C 16/52* (2013.01)

(58) Field of Classification Search
CPC . H01J 2237/332–3348; C23C 16/4586; C23C 16/4584; C23C 16/46; C23C 16/52
(Continued)

(56) References Cited

U.S. PATENT DOCUMENTS 5,782,979 A  7/1998 Kaneno et al.
5,911,461 A  6/1999 Sauter et al.
(Continued)

FOREIGN PATENT DOCUMENTS

DE  19940033 A1  5/2001
DE  102 32 731 A1  2/2004
(Continued)

OTHER PUBLICATIONS

International Preliminary Report on Patentability issued Dec. 8, 2020, from The International Bureau of WIPO, for International Patent Application No. PCT/EP2019/064392 (filed Jun. 4, 2019), 19 pgs.
(Continued)

*Primary Examiner* — Charlee J. C. Bennett
(74) *Attorney, Agent, or Firm* — Ascenda Law Group, PC

(57) ABSTRACT

A cover plate, for a CVD reactor, has a circumferential edge extending on a circular arc line, or a plurality of identically configured cover plates can be arranged in a circle such that their respective outer edges extending along circular arcs complement each other to form a complete circle. Storage spaces for substrates or substrate holders supporting substrates are located within the surface of the cover plate. The cover plate has openings which tunnel through the cover plate, and through which the upper side of a susceptor is visible, so that an optical temperature measurement can be carried out through the respective openings.

14 Claims, 10 Drawing Sheets

(58) Field of Classification Search
USPC ...... 118/715–733 W, 728; 156/345.1–345.55
See application file for complete search history.

(56) References Cited

U.S. PATENT DOCUMENTS

| | | | |
|---|---|---|---|
| 6,641,302 B2* | 11/2003 | Li | G01J 5/0853 374/126 |
| 8,152,927 B2* | 4/2012 | Kaeppeler | C23C 16/4586 118/728 |
| 2001/0047762 A1* | 12/2001 | Hayashi | H01L 21/68785 118/500 |
| 2004/0175939 A1 | 9/2004 | Nakamura et al. | |
| 2006/0102081 A1* | 5/2006 | Ueno | H01L 21/68771 118/728 |
| 2006/0269390 A1 | 11/2006 | Nakamura et al. | |
| 2008/0014057 A1* | 1/2008 | Juergensen | C23C 16/54 414/217 |
| 2008/0206464 A1* | 8/2008 | Kappeler | C30B 29/40 118/620 |
| 2009/0308319 A1 | 12/2009 | Cheng et al. | |
| 2010/0216261 A1 | 8/2010 | Brenninger et al. | |
| 2011/0143016 A1 | 6/2011 | Hong et al. | |
| 2012/0070136 A1* | 3/2012 | Koelmel | F27B 5/18 392/416 |
| 2012/0156374 A1 | 6/2012 | Gurary et al. | |
| 2013/0193132 A1* | 8/2013 | Serebryanov | F27B 17/0025 219/385 |
| 2015/0075431 A1 | 3/2015 | Barriss et al. | |
| 2015/0187620 A1* | 7/2015 | Gurary | H01L 21/68764 118/728 |
| 2015/0345016 A1* | 12/2015 | Huang | C23C 16/4585 118/728 |
| 2016/0172165 A1 | 6/2016 | Jeon et al. | |
| 2016/0333479 A1* | 11/2016 | Boyd | C23C 16/46 |
| 2018/0251909 A1* | 9/2018 | Nakabayashi | H01L 21/02529 |
| 2021/0238740 A1* | 8/2021 | Wright | C30B 25/12 |
| 2021/0254214 A1* | 8/2021 | Wright | H01L 21/68764 |
| 2022/0186374 A1* | 6/2022 | Ruda Y Witt | H01L 21/68735 |

FOREIGN PATENT DOCUMENTS

| | | |
|---|---|---|
| DE | 10 2005 018 162 A1 | 10/2006 |
| DE | 10 2005 018 161 A1 | 11/2006 |
| DE | 10 2009 010 555 A1 | 9/2010 |
| DE | 10 2011 053 498 A1 | 3/2013 |
| DE | 10 2012 106 796 A1 | 1/2014 |
| DE | 10 2013 111 165 A1 | 4/2015 |
| DE | 10 2014 114 947 A1 | 11/2015 |
| DE | 10 2014 117 388 A1 | 6/2016 |
| DE | 10 2016 103 530 A1 | 8/2017 |
| DE | 11 2016 003 443 T5 | 4/2018 |
| DE | 10 2017 101 648 A1 | 8/2018 |
| EP | 2498277 A1 | 9/2012 |
| JP | 2016-012680 A | 1/2016 |
| JP | 2016-035080 A | 3/2016 |

OTHER PUBLICATIONS

International Preliminary Report on Patentability issued Dec. 15, 2020, from The International Bureau of WIPO, for International Patent Application No. PCT/EP2019/065688 (filed Jun. 14, 2019), 18 pgs.
International Preliminary Report on Patentability issued Dec. 22, 2020, from The International Bureau of WIPO, for International Patent Application No. PCT/EP2019/065721 (filed Jun. 14, 2019), 33 pgs.
Written Opinion mailed Sep. 30, 2019, from the ISA/European Patent Office, for International Patent Application No. PCT/EP2019/064392 (filed Jun. 4, 2019), English translation, 7 pgs.
Written Opinion mailed Sep. 30, 2019, from the ISA/European Patent Office, for International Patent Application No. PCT/EP2019/065688 (filed Jun. 14, 2019), English translation, 8 pgs.
Written Opinion mailed Nov. 20, 2019, from the ISA/European Patent Office, for International Patent Application No. PCT/EP2019/065721 (filed Jun. 14, 2019), English translation, 15 pgs.
Amendment filed Apr. 20, 2022, for U.S. Appl. No. 15/734,736, filed Dec. 3, 2020, 11 pgs.
Advisory Action dated Aug. 3, 2022, for U.S. Appl. No. 15/734,736, filed Dec. 3, 2020, 3 pgs.
Appeal Brief filed Sep. 29, 2022, for U.S. Appl. No. 15/734,736, filed Dec. 3, 2020, 27 pgs.
Examiner's Answer dated Nov. 14, 2022, for U.S. Appl. No. 15/734,736, filed Dec. 3, 2020, 12 pgs.
Reply Brief filed Jan. 13, 2023, for U.S. Appl. No. 15/734,736, filed Dec. 3, 2020, 19 pgs.
International Search Report mailed Sep. 30, 2019, from the ISA/European Patent Office, for International Patent Application No. PCT/EP2019/064392 (filed Jun. 4, 2019), 6 pages.
Written Opinion mailed Sep. 30, 2019, from the ISA/European Patent Office, for International Patent Application No. PCT/EP2019/064392 (filed Jun. 4, 2019), 10 pages.
International Search Report mailed Sep. 30, 2019, from the ISA/European Patent Office, for International Patent Application No. PCT/EP2019/065688 (filed Jun. 14, 2019), 8 pages.
Written Opinion mailed Sep. 30, 2019, from the ISA/European Patent Office, for International Patent Application No. PCT/EP2019/065688 (filed Jun. 14, 2019), 8 pages.
International Search Report mailed Nov. 20, 2019, from the ISA/European Patent Office, for International Patent Application No. PCT/EP2019/065721 (filed Jun. 14, 2019), 12 pages.
Written Opinion mailed Nov. 20, 2019, from the ISA/European Patent Office, for International Patent Application No. PCT/EP2019/065721 (filed Jun. 14, 2019), 16 pages.
Final Office Action dated Jun. 8, 2022, for U.S. Appl. No. 15/734,736, filed Dec. 3, 2020, 8 pgs.
Non-Final Office Action dated Jan. 20, 2022, for U.S. Appl. No. 15/734,736, filed Dec. 3, 2020, 11 pgs.
AIXTRON SE, "Device useful for thermal treatment of a semiconductor substrate, comprises susceptor, which forms the base of a process chamber and comprises substrate support base, substrate support ring and heat source", DE 102012106796A, Jan. 30, 2014, English translation, 13 pgs.
Amendment filed Jul. 22, 2022, for U.S. Appl. No. 15/734,736, filed Dec. 3, 2020, 10 pgs.
English Translation JP2016012680A (Year: 2016), 8 pgs.
English Translation DE102013111165A1 (Year: 2013), 8 pgs.
Non-Final Office Action dated Jan. 25, 2024, for U.S. Appl. No. 17/250,194, filed Dec. 11, 2020, 11 pgs.
Amendment filed Aug. 20, 2024, for U.S. Appl. No. 17/250,194, filed Dec. 11, 2020, 8 pgs.
Decision on Appeal dated Sep. 24, 2024, for U.S. Appl. No. 15/734,736, filed Dec. 3, 2020, 7 pgs.
Final Office Action mailed Jun. 20, 2024, for U.S. Appl. No. 17/250,194, filed Dec. 11, 2020, 7 pgs.
Notice of Allowance mailed Aug. 28, 2024, for U.S. Appl. No. 17/250,194, filed Dec. 11, 2020, 9 pgs.
Notice of Allowance mailed Oct. 21, 2024, for U.S. Appl. No. 15/734,736, filed Dec. 3, 2020, 6 pgs.

* cited by examiner

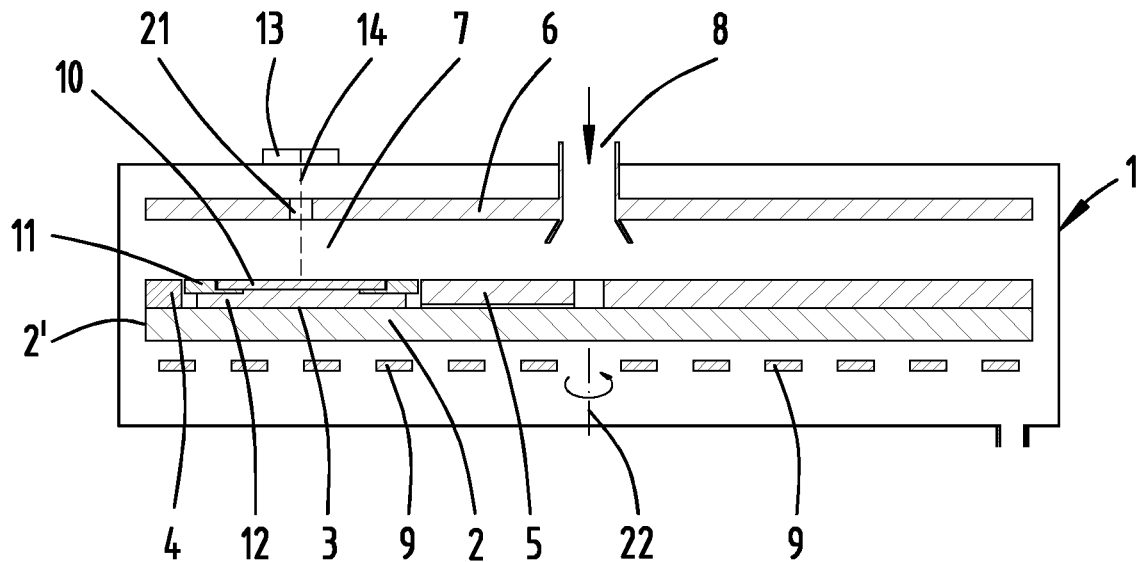
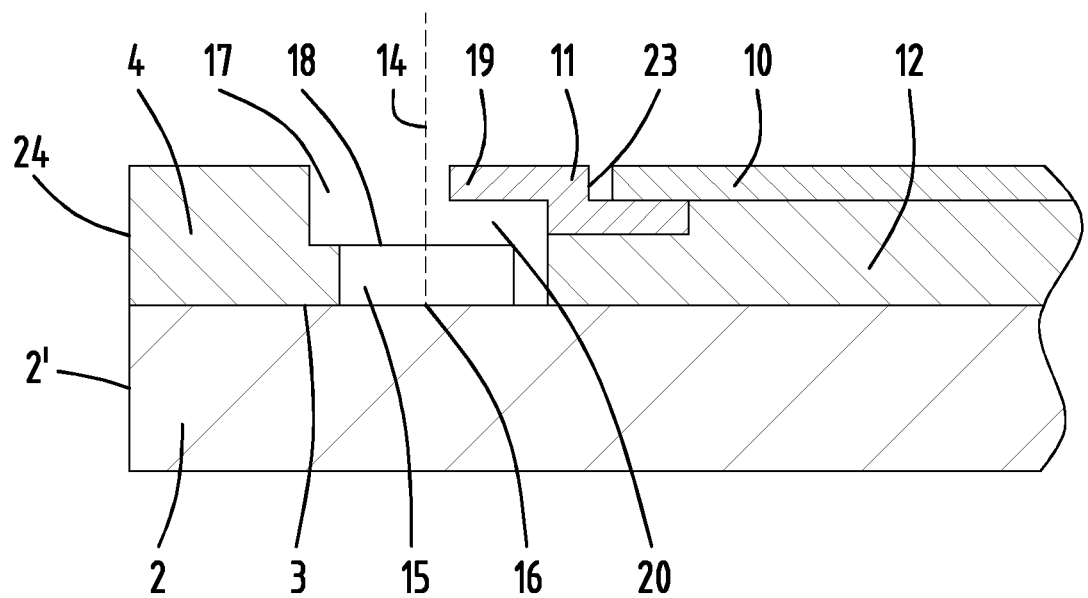

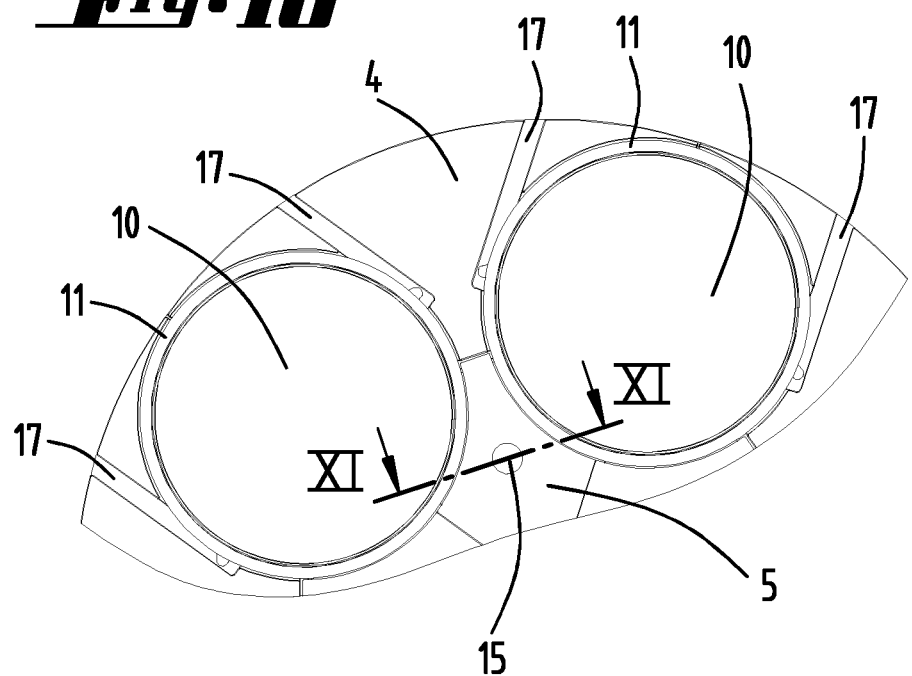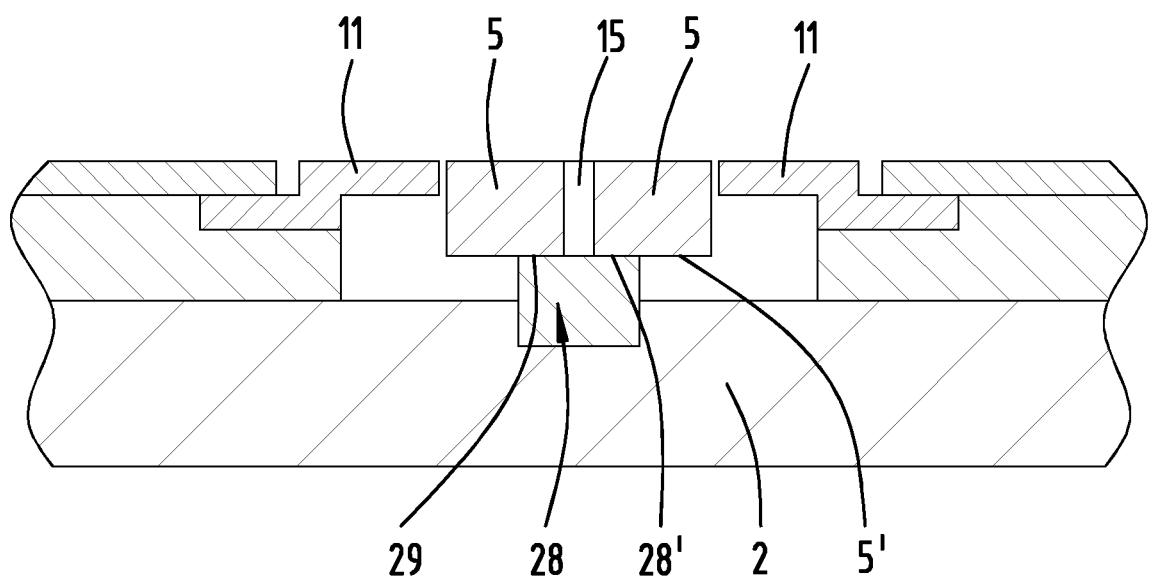

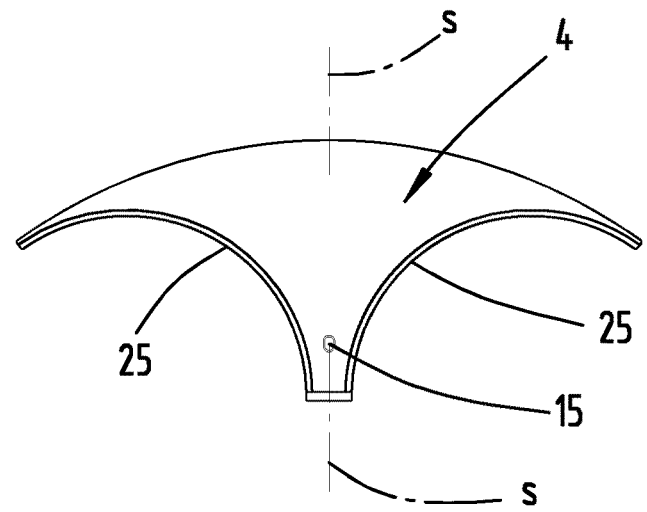
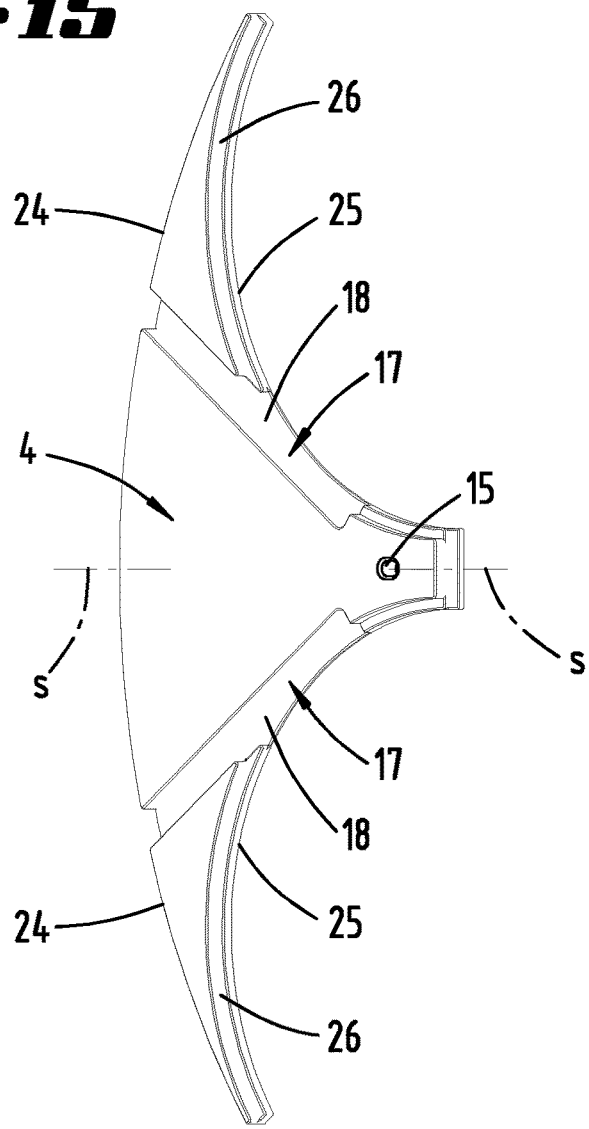

ARRANGEMENT FOR MEASURING THE SURFACE TEMPERATURE OF A SUSCEPTOR IN A CVD REACTOR

RELATED APPLICATIONS

This application is a National Stage under 35 USC 371 of and claims priority to International Application No. PCT/EP2019/065721, filed 14 Jun. 2019, which claims the priority benefit of DE Application No. 10 2018 114 706.6, filed 19 Jun. 2018 and DE Application No. 10 2019 114 249.0, filed 28 May 2019.

FIELD OF THE INVENTION

The invention relates to a device for the deposition of layers containing, in particular, elements of the $III^{rd}$ and $V^{th}$ main groups on substrates supported on a face of a susceptor facing towards a process chamber, and arranged in free spaces between cover plates, wherein means are provided for the optical measurement of the temperature of the susceptor.

The invention further relates to a susceptor arrangement, consisting of a susceptor and a plurality of cover plates, and a cover plate for use in a device or susceptor arrangement.

BACKGROUND

Devices of the type described above are known in the prior art as CVD reactors, and in particular MOCVD reactors, for purposes of chemical vapor deposition, in particular using organometallic gaseous source materials for the deposition of III-V semiconductor layers on substrates in a process chamber of an MOCVD reactor. The composition of the layer or layer sequence deposited on the substrate, and the crystalline or electrical quality of the deposited layers, depend to a large extent on the temperature within the process chamber, or on the surface of the substrate.

The substrates rest on substrate holders, which in turn are supported by a susceptor. The substrate holders can be rotationally driven about their own axes. The circular susceptor can also be rotationally driven about its figure axis. The heating of the susceptor and the process chamber to the process temperature is undertaken by means of a heating entity, which is usually arranged below the susceptor, while the substrates are arranged above the susceptor. To control the heating power, a temperature control entity is used, which measures the temperature of the susceptor on the lower face of the susceptor. The measurement is made optically, for example by means of a light guide and a pyrometer.

It is also known in the art for the substrate temperature to be measured optically, e.g. by means of a pyrometer, which is arranged above a process chamber ceiling, and which has a beam path that passes through an opening in the process chamber ceiling.

When using a pyrometer to measure the surface temperature of the substrate, it is only possible to control the substrate temperature if a sufficient signal is present, which in particular is not the case if the substrate, or the layer deposited on the substrate, is transparent at the wavelength used by the pyrometer. By virtue of the heat flow through the susceptor from the rear face facing towards the heating entity to the upper face supporting the substrates, a temperature difference exists between the upper and lower faces of the susceptor. This temperature difference depends on the heat radiation properties of the upper face of the susceptor, and the cover plate arranged on the susceptor.

The prior art includes the following documents: US 2004/0175939 A1, US 2006/0269390 A1, JP 2016-035080 A, US 2006/0102081 A1, US 2009/0308319 A1, US 2011/0143016 A1, DE 10 2009 010 555 A1, DE 10 2014 117 388 A1 and DE 11 2016 003 443 T5.

From US 2004/0175939 A1, a cover plate with an edge-side opening is already of known art. A similar cover plate is described in US 2006/0269390 A1. JP 2016-35080 A describes a cover plate with a slot open towards the peripheral edge.

SUMMARY OF THE INVENTION

The invention is based on the object of specifying measures with which the temperature of the susceptor, in particular in the vicinity of a substrate, can be more precisely controlled.

The object is achieved by the invention specified in the claims. The subordinate claims not only represent advantageous developments of the subject matter claimed in the independent claims, but are also independent solutions of the object.

First and foremost, it is envisaged that at least one of the cover plates arranged on the upper face of the susceptor, wherein in particular it is envisaged that free spaces are provided between the cover plates to accommodate the substrates, has an opening through which the upper face of the susceptor can be seen. The beam path of a means for the measurement of the temperature can pass through this, in particular, small opening. The means for temperature measurement can take the form of a pyrometer, which is arranged outside the process chamber, and in particular above the process chamber ceiling. The beam path of the pyrometer can hereby pass through an opening in the process chamber ceiling and the opening in the cover plate. Forms of embodiment of the inventions can have a plurality of substrates, which are spaced apart from each other on the face of the susceptor facing towards the process chamber. The substrates can be spatially separated from each other. A plurality of cover plates can be provided in the spaces between the substrates. However, it can also be envisaged that only one cover plate is provided. This can have a circular opening, in which a substrate is placed. However, a single cover plate can also have a plurality of circular openings, in each of which a substrate is placed.

The opening in the process chamber ceiling and the opening of the cover plate are arranged, that is to say, aligned relative to each other, such that the beam path of the optical means, that is to say, for example, a pyrometer, passes through both openings and impinges on the surface of the susceptor. In particular, it is here envisaged that the one- or multi-part cover plate has an edge running along a circular arc line, and in particular that the one- or multi-part cover plate has an edge running along a circular arc line. The edges of a plurality of cover plates can complement each other to form a full circle. The latter forms an outer edge which outwardly bounds a storage surface on which a large number of substrates are stored; the substrates extend along a circular region around a center of the susceptor. The circular region is bounded by an outer circular arc line and an inner circular arc line. The region on which the substrates are arranged is therefore, in particular, an annular surface. This annular surface can have a center line running along a circular arc line, on which the centers of the substrates or the centers of substrate holders, each of which supports one or a plurality of substrates, are located. The openings of the cover plate are preferably located in the annular-shaped region. The cover plates can be segments of a circular cover body. The opening can be arranged between two inner edges of the cover plate, each extending along circular arc lines. The opening can be located on an axis of symmetry running in a radial direction with respect to the circular body. The opening can also be located on a circular arc-shaped strip, which extends over the centers of the substrates arranged on a circular arc line. The openings are then only slightly spaced apart from a circular arc line. The opening is preferably located centrally between two inner edges. Each segment or each cover plate can be formed in one piece. However, it is also possible to construct a cover plate or a segment of the cover plate in a sandwich-like manner, for example, a from plurality of flat bodies located on top of each other.

In a development of the invention, it is envisaged that the opening of the cover plate is open towards an edge of the cover plate. It can also be envisaged that the opening is arranged at an edge adjacent to the substrate. The opening can be immediately adjacent to the edge of the substrate. It can be envisaged that the cover plate is adjacent to an outer edge of the susceptor. Radially outer cover plates and radially inner cover plates can be provided. The opening can be assigned to the radially inner cover plate, or the radially outer cover plate. In a preferred variant, the opening is assigned to the radially outer located cover plate. A plurality of radially outer cover plates can be provided, which are arranged in the peripheral direction along the edge of the susceptor extending along a circular arc line. It is sufficient if only one of the cover plates has an opening; preferably all cover plates located next to each other in the peripheral direction, and in particular the radially outer cover plates, have at least one, preferably two openings, wherein in particular it is envisaged that all openings are arranged on a circular arc line, which extends around a figure axis of the susceptor, about which figure axis the susceptor can be rotationally driven. The susceptor can also consist of graphite, in particular coated graphite. The cover plates can also consist of graphite, in particular coated graphite. The cover plates can also consist of another material, for example quartz or another temperature-resistant material. In particular, it is envisaged that a plurality of cover plates, in particular inner and outer plates, surround a circular free space. For this purpose, the cover plates have inner edges running along a circular arc line, within which at least one substrate is arranged. Circular substrate holders can be arranged within the free spaces between the cover plates. These substrate holders, which can consist of graphite or a similar suitable material, can be rotationally driven about their figure axes. This can take place by way of a gas pivot bearing. For this purpose, gas flows can escape from the upper face of the susceptor, forming a gas cushion on which the substrate holder rests. The substrate holder can be set in rotation by a suitable directionality of the gas flows exiting from the openings. Each substrate holder can carry a supporting ring that rests on the edge of the substrate holder. The supporting ring can have a radially inner supporting shoulder, on which the edge of the substrate rests. A radially outwards projecting projection of the supporting ring can be gripped by the tines of a fork-shaped gripper, for purposes of loading or unloading substrates into or from the CVD reactor, that is to say, the susceptor arrangement. For purposes of engaging with the tines of the gripper, the cover plates form channels that are open towards the radially outer edge of the susceptor arrangement. The two channels run parallel to each other and in a tangential direction to the substrates. The channels have a floor. In the region of the edge of the substrate, that is to say, the inner edge of the cover plate, the channels are open towards the free space. In particular, it is envisaged that the floor of the channel has the opening through which passes the beam path of the optical means for temperature measurement. Here, the opening can be assigned to the region of the floor that is directly adjacent to the inner edge of the cover plate. In particular, it is envisaged that each of the plurality of cover plates forms pairs of parallel channels, which are open towards the radially outer edge of the cover plate. The means of temperature measurement can be a pyrometer, with which the surface temperature of the substrate can also be measured. The temperature is measured while the susceptor rotates about its axis of rotation, wherein the beam path of the optical measuring entity remains stationary and, as a consequence of the rotation of the travels susceptor, over the substrates so as to determine their surface temperatures. Here it can be envisaged that the beam path has a radial distance from the axis of rotation of the susceptor that corresponds to the radial distance of the center of each substrate from the center of the susceptor. The substrates are preferably located equally spaced apart from the center of the susceptor. The openings for the passage of the beam path can be located on the same, or a similar, circular arc line around the center of rotation of the susceptor, on which the centers of the substrates are also located. As a consequence, the beam path, after passing over each substrate, passes through the opening provided in the cover plate for purposes of measuring the susceptor surface. The pyrometer is controlled by an electronic measurement entity, and is able to deliver measured values at a sufficiently high frequency, such that a small opening area is sufficient to obtain temperature readings of the susceptor surface. The radius of the susceptor is about 300 mm. The radius of a substrate holder is about 100 mm. The width of a channel is approximately between 10 mm and 15 mm. The area of the opening in the cover plate can be between 10 mm$^2$ and 100 mm$^2$. It is preferably a maximum of 80 mm$^2$. The opening can have a rounding with a radius of 4 mm. The vertex of the rounding can be arranged about 7 mm-8 mm from the open edge of the duct. In a development of the invention, it is envisaged that the surface of the susceptor is provided with a suitable coating for purposes of protecting the surface of the susceptor. The coating consists of a resistant material such as silicon carbide (Sic). In order to avoid a lack of protection of the susceptor surface at positions where the opening is located, in particular to avoid etching of the unprotected places below the opening in the course of cleaning of the CVD reactor by the introduction of an etching gas, appropriate measures can be undertaken, as specified below. These measures also prevent the accumulation of residues, for example metallic gallium, inside the opening. These, in particular drop-shaped gallium accumulations, could attack the SiC coating. For this purpose, it is particularly advantageous the susceptor surface has an opening, into which an insert is inserted, wherein the upper face of the insert then forms the surface that is visible to the pyrometer. The inserts can be made of SiC. The inserts can rest loosely on the susceptor, rest loosely in openings, or can be connected to the susceptor in form fits. The inserts can be spaced apart from the cover plates. However, the inserts can also support the cover plates. In this case, it is advantageous if the cover plates rest in a gas-tight manner on the inserts. By this means, the regions outside the inserts are protected from an etching gas used to clean the CVD reactor.

BRIEF DESCRIPTION OF THE DRAWINGS

In what follows, an example embodiment is explained with the aid of the accompanying figures. Here:

FIG. 2 shows a cross-section through the susceptor arrangement illustrated in FIG. 1 along the line II-II, wherein in addition other parts of a CVD reactor housing 1 are also schematically represented, FIG. 3 shows the cross-section along the line III-III in FIG. 1, FIG. 10 shows an illustration similar to FIG. 1 of a sixth example embodiment, FIG. 11 shows the cross-section along the line XI-XI in FIG. 10, FIG. 14 shows a further example embodiment in an illustration as in FIG. 4, wherein the opening extends centrally between two circular arc-shaped boundary lines, FIG. 15 shows a further example embodiment.

DETAILED DESCRIPTION

Figure 1:
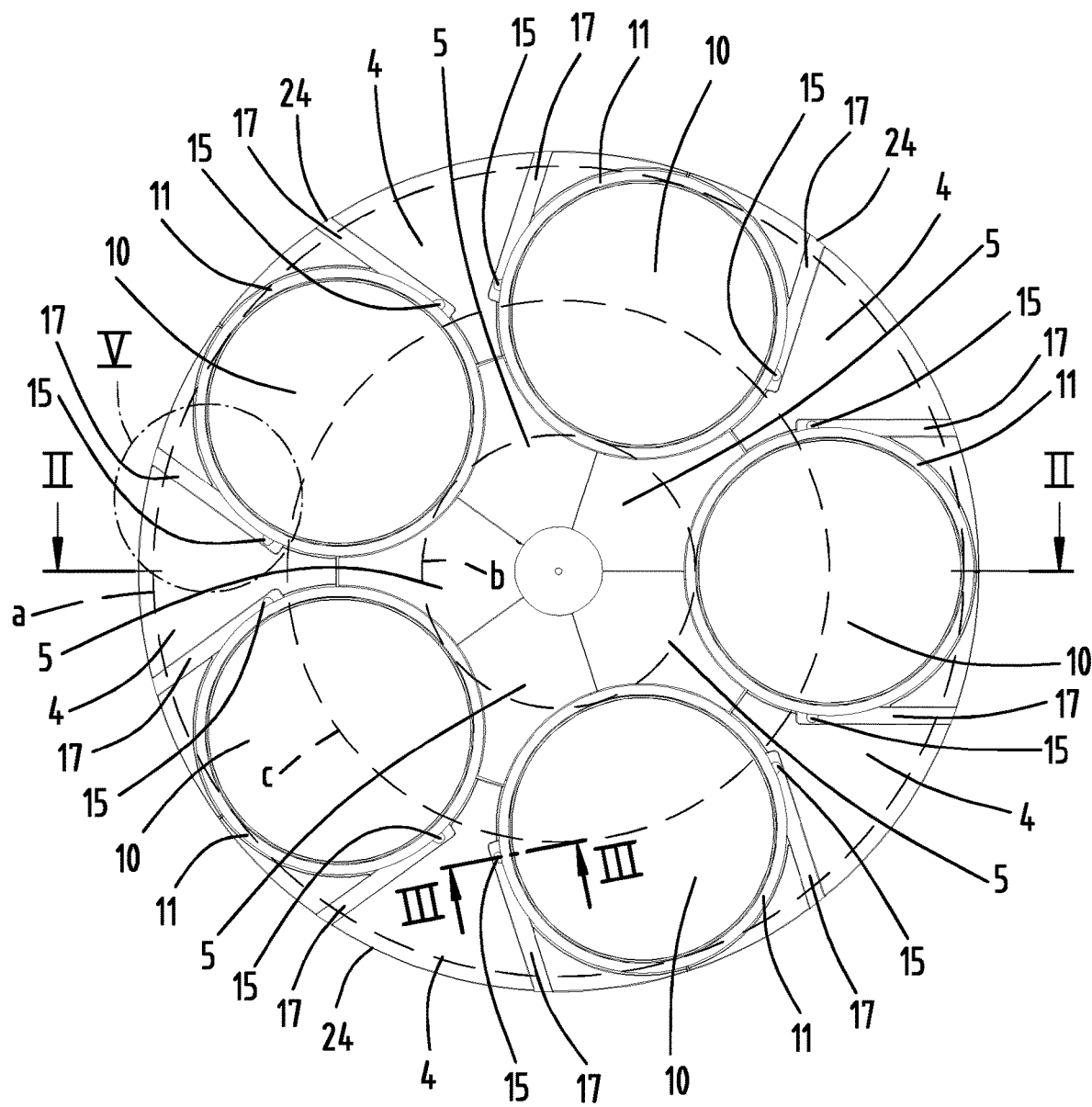
FIG. 1 shows a plan view onto a susceptor arrangement.
Figure 4:
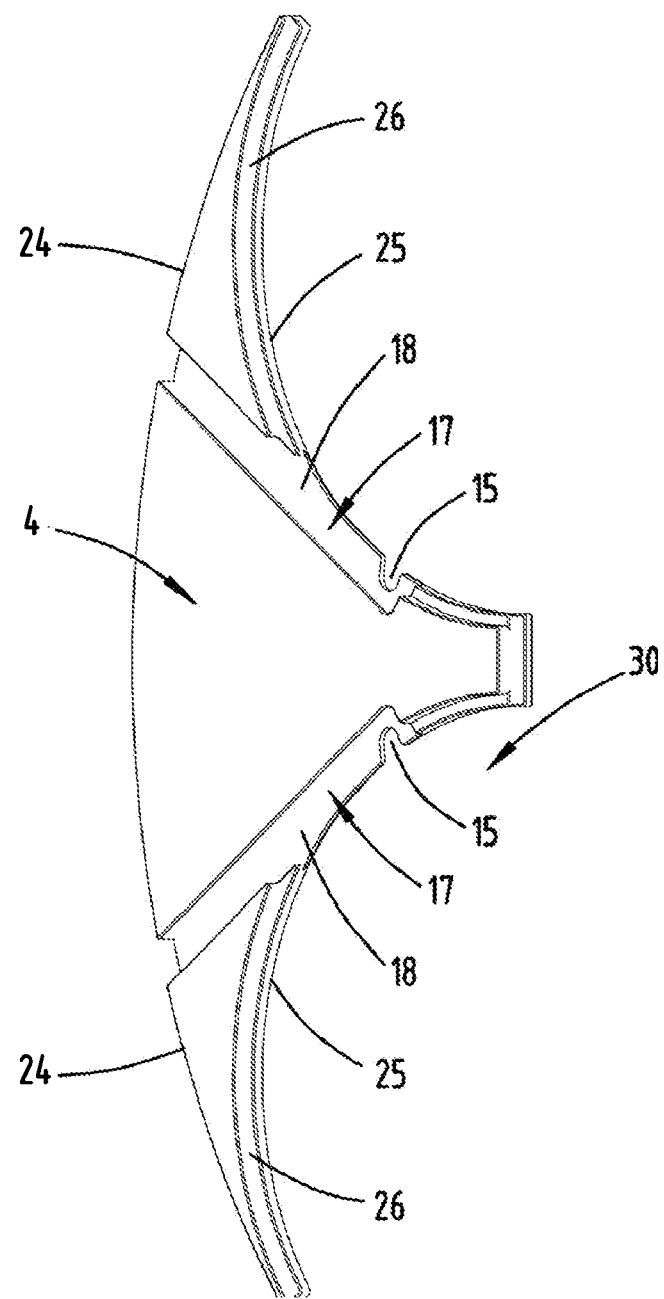
FIG. 4 shows, in perspective, a radially outer cover plate 4.
Figure 5:
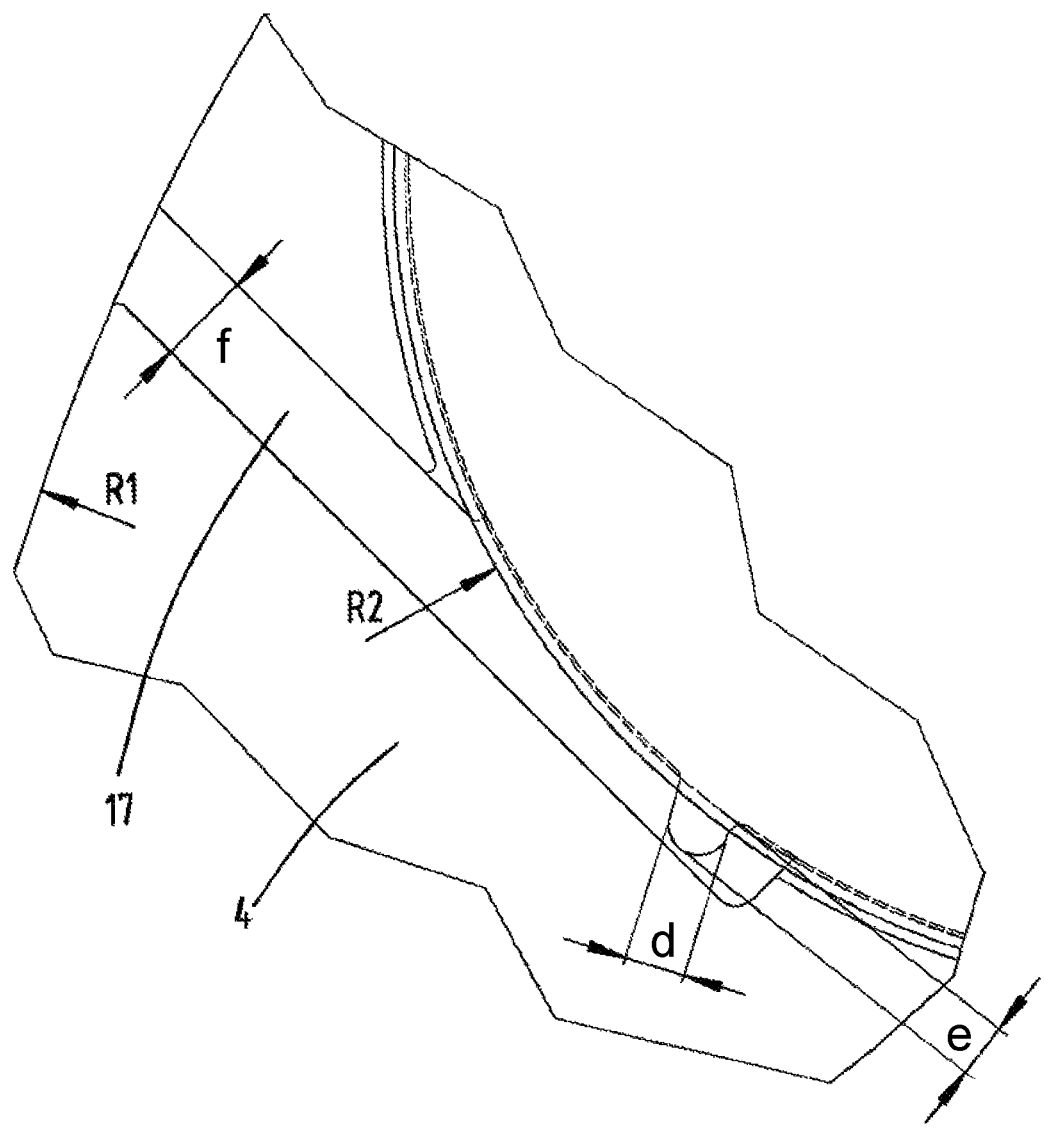
FIG. 5 shows an enlarged detail of the cover plate 4.

The CVD reactor 1, which is only illustrated schematically in the figures, has a gas-tight housing made of stainless steel, which can be evacuated. Inside the CVD reactor housing 1 there is located a circular disk-shaped susceptor 2, consisting of graphite or a similar suitable material, the edge 2' of which runs along a circular arc line. The upper face 3 of the susceptor 2 faces towards a process chamber 7, which is bounded at the top by a process chamber ceiling 6. Approximately in the region of the center of the susceptor 2, which corresponds to an axis of rotation 22, around which the susceptor 2 can be rotationally driven, there is located a gas inlet 8. Gas can be fed through the gas inlet element 8 from above, through an opening in the process chamber ceiling 6. However, it is also envisaged that the gas is fed from below, through a central opening of the susceptor 2.

Below the susceptor 2 there is located a heating entity 9, with which to heat the susceptor 2 to a susceptor temperature that is sufficiently high for a process temperature in the process chamber 7 to be reached, at which gaseous source materials, fed into the process chamber 7 through the gas inlet 8, are decomposed. The gaseous source materials can take the form of organometallic compounds of the III$^{rd}$ main group and hydrides of the V$^{th}$ main group. For example, an organometallic compound containing gallium can be fed with ammonia through the gas inlet, together with a carrier gas, so as to deposit GaN on a substrate 10.

On the upper face 3 of the susceptor 2, facing towards the process chamber 7, there are located substrate holders 12, which have a circular disk-shaped configuration, and are arranged on a circular arc line around the axis of rotation 22. Each circular disk-shaped substrate holder 12 carries a supporting ring 11, which has a radially outer projection 19 and a radially inner supporting shoulder 23. The edge of the substrate 10 rests on the supporting shoulder 23, at least or only, during transport. Channels and gas nozzles (not illustrated) are provided, which are located below the substrate holder 12 in the upper face 3 of the susceptor 2, so as to create a gas cushion below the substrate holder 12, which is able to rotationally drive the substrate holder 12 about its figure axis.

The arrangement consisting of the substrate holder 12 and the supporting ring 11 is in each case arranged in a window, which is framed by cover plates 4, 5. At least one inner cover plate 5 is provided, which has radially outer edges extending along a circular arc line. Adjacent to these edges are the edges of the substrate 10, of the supporting ring 11, or of the substrate holder 12. In an example embodiment, a plurality of inner cover plates 5 are arranged around an inner opening. The number of radially outer cover plates 4 and radially inner cover plates 5 can correspond to the number of substrates 10. In the example of embodiment the number is 5.

A plurality of radially outer cover plates 4 is provided, the radially outer edges 24 of which extend along the radially outer edge 2' of the susceptor 2. The outer cover plates 4 have radially inner edges 25, which extend along a circular arc line, and which, together with the radially outer edges of the inner cover plate 5, form a circular arc. The radially inner edge 25 of the outer cover plate 4 can run along a larger radius than the radially outer edge of the inner cover plate 5.

The radially inner edges 25 of the outer cover plates 4 can form a step 26.

An outer cover plate 4 forms at least one channel 17 that is open towards the radially outer edge 24 of the cover plate 4, in which channel is formed a floor 18, which is spaced apart from an upper face of the outer cover plate 4 facing towards the process chamber 7. The width "f" of the channel 17 is about 10 mm-15 mm. In an example embodiment, the radius R1 of the susceptor 2 is about 300 mm-350 mm. In an example embodiment, the radius R2 of the substrate holder 12 is about 100 mm-120 mm.

For each substrate 10, there can be two channels 17, running parallel to each other, which run tangentially to the substrate 10. Tines of a fork-shaped gripper can engage with the channels 17, so as to engage under the projection 19 of the supporting ring 11, so as to lift the supporting ring 11 together with the substrate 10. To this end, a free space extends between the floor 18 of the channel 17 and the lower face of the overhang 19, for purposes of the underneath engagement. It is also envisaged that the outer cover plate does not have any channels 17.

In accordance with the invention, it is envisaged that at least one of the cover plates 4, 5 forms an opening 15, through which a section of the upper face 3 of the susceptor 2 is visible. The opening 15 thus forms a region of the cover plate arrangement that does not cover the upper face of the substrate.

In an example embodiment, the opening 15 is provided in an outer cover plate 4. In an example embodiment, the openings 15 are arranged directly adjacent to the edge 25, so that the openings 15 form cuts into the edge 25 of the outer cover plate. In an example embodiment, provision is also made for the openings 15 in each case to be arranged in the region of a floor 18 of a channel 17. Here the openings 15 are arranged in the radially inner end region of a channel 17, that is to say, where the substrates 10 have their greatest circumferential extent around the axis of rotation 22. The openings 15 can be arranged on an arc line around the axis of rotation 22, on which the centers of the substrates 10, that is to say, of the supporting rings 11, and the substrate carriers 12, are also arranged. Each of the channels 17, assigned in pairs to a substrate carrier 12, that is to say, to a supporting ring 11, preferably has an opening 15.

FIG. 1 shows a circular arc line marked as "a" around the center of the susceptor arrangement that is illustrated in the figure. The line "a" forms an outer boundary line of an annular surface, on which the substrates 10 rest. The line "a" is tangential to the radially outwardly facing sections of the edges of the substrates 10. A line "b", which is tangential to the radially inner sections of the edges of the substrates 10, and is also a circular arc line around the center of the susceptor arrangement, bounds the annular surface in the radially inward direction. The openings 15 are preferably located in the annular surface, wherein the openings 15 are closer to a circular arc line "c" than to the circular arc lines "a", "b", which bound the annular surface. The circular arc line "c" forms a center line of the annular surface. It can run through the centers of the substrates 10. The opening 15 can thus be arranged on a central circular strip of the annular surface, which has a width that is approximately half the radial distance between the two edge lines "a" and "b".

In an example embodiment, the opening 15 is open towards the edge 25 of the cover plate 4. The opening width "d" is about 7 mm-10 mm, preferably 8 mm. The U-shaped edge of the opening 15 has a rounded section extending along a semicircle line, which section has a rounding radius of 4 mm. In overall terms, the opening 15 extends about 5 mm-10 mm away from the edge 25. The vertex of the rounded line has a distance "e" of about 7 mm-8 mm from the edge 25.

In particular, it is envisaged that the area of the opening 15 should be a maximum of 80 mm$^2$. In the second example embodiment illustrated in FIG. 6, the upper face 3 of the susceptor 2 is coated with a silicon carbide coating.

Figure 7:
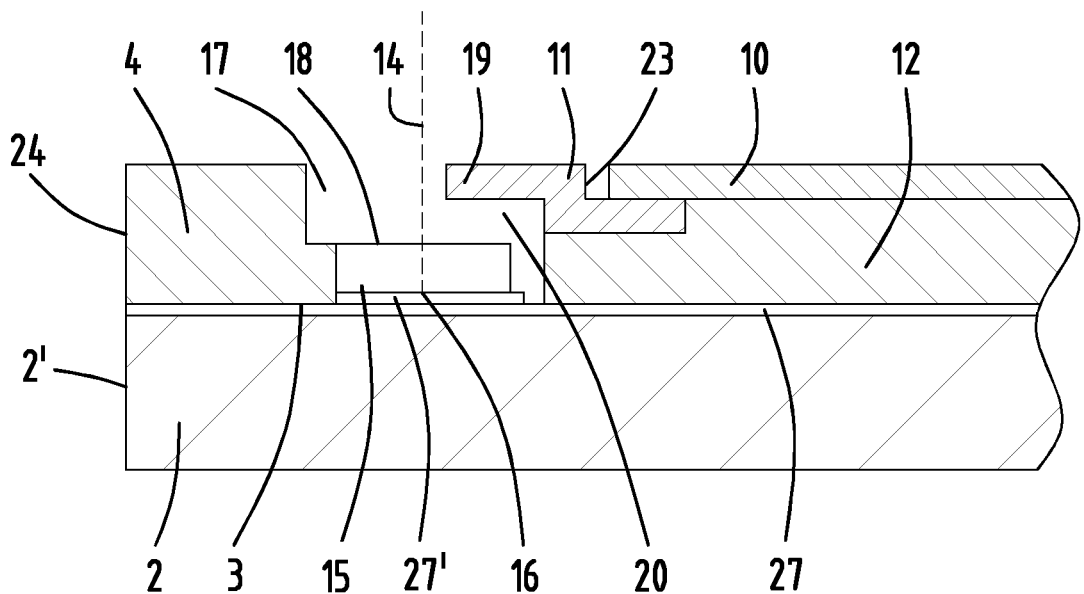
FIG. 7 shows an illustration as in FIG. 3 of a third example embodiment.

In the third example embodiment illustrated in FIG. 7, the coating 27 is thickened in the region of the opening. Here, a thickened section 27' of the coating 27 forms a kind of elevation, which extends into the opening 15.

However, in an example embodiment that is not illustrated, the edge of the opening 15 can also rest on the thickened region 27' of the coating 27.

Figure 8:
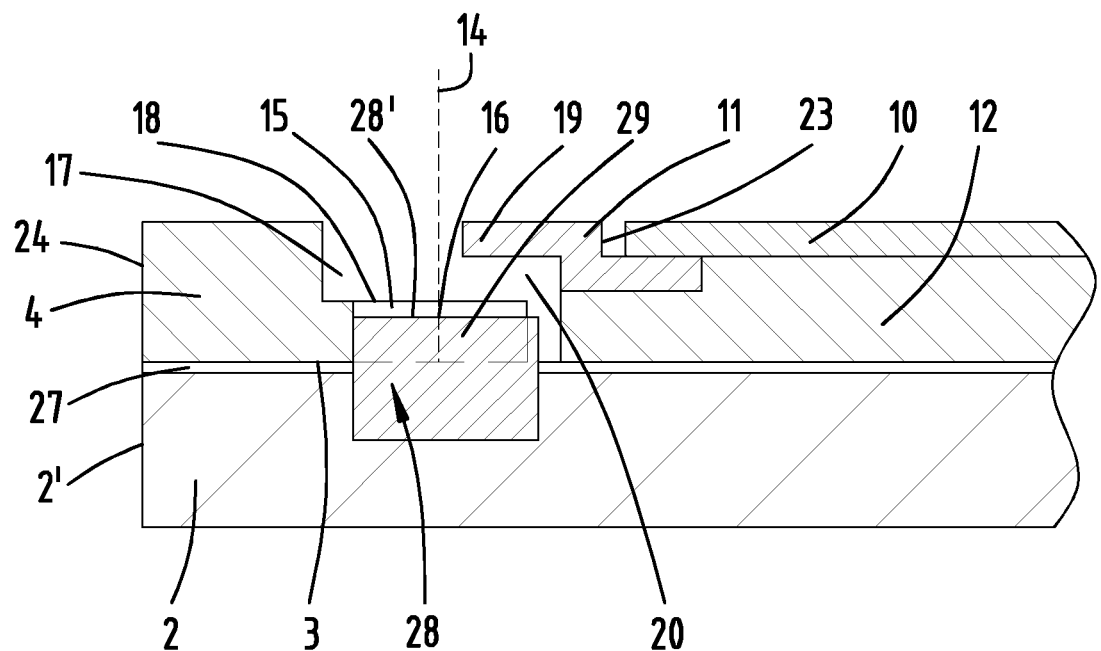
FIG. 8 shows an illustration as in FIG. 3 of a fourth example embodiment.

In the fourth example embodiment illustrated in FIG. 8, the surface of the susceptor 2 that is visible through the opening 15 is formed from the upper face 28' of an elevation 29. In this example embodiment, an insert 28 is inserted into a recess in the upper face 3 of the susceptor 2. Here a section of the insert 28 forms the elevation 29. The insert 28 consists of a resistant material, for example silicon carbide, and is inserted into the recess of the susceptor 2, which, for example, is made of graphite and coated with a silicon carbide layer 27.

Figure 9:
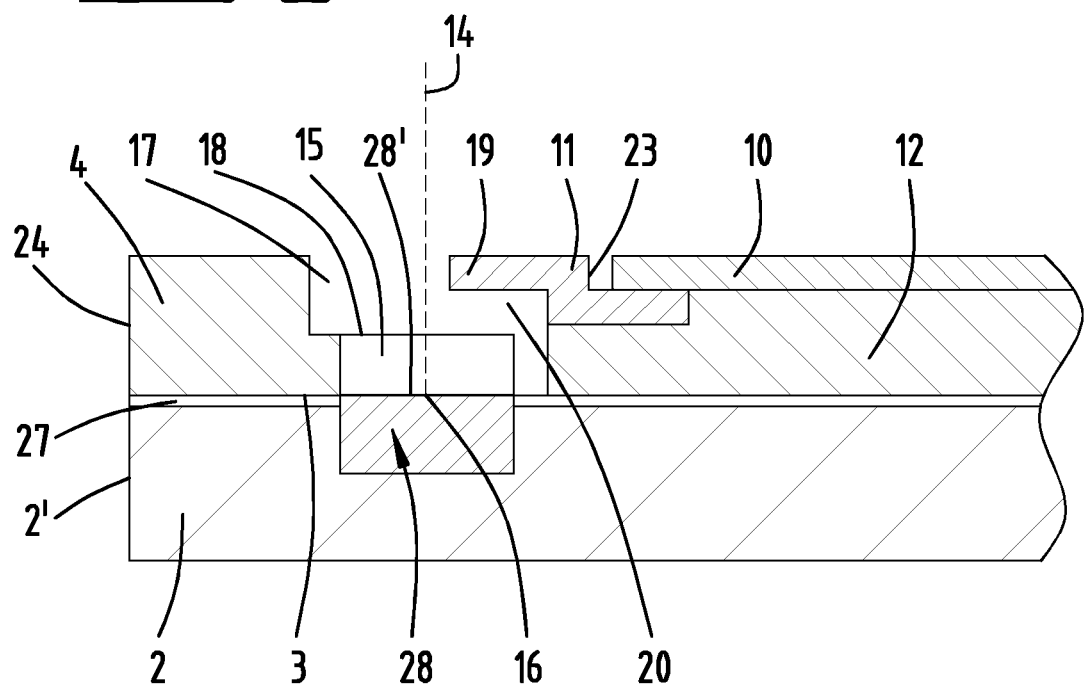
FIG. 9 shows an illustration as in FIG. 3 of a fifth example embodiment.

In the fifth example embodiment illustrated in FIG. 9, the insert 28, which here also is inserted in a recess of the susceptor 2, forms a surface 28', which lies flush with the surface of the coating 27. Here too, the coating 27 and the insert 28 are made of SiC.

The opening 15 can be provided not only on the edge of an outer cover plate 4 or an inner cover plate 5. It is also envisaged that the opening 15 is arranged in an outer or inner cover plate 4, 5, so that the opening 15 is encircled.

The sixth example of embodiment illustrated in FIG. 10 shows an inner cover plate 5, which is provided with the opening 15.

FIG. 11 shows that the cover plate 5 is spaced apart by a gap from the upper face 3 of the susceptor 2. It rests on an elevation 29, which here is formed by an insert 28, in a similar manner to the example embodiment illustrated in FIG. 8. The upper face 28' of the elevation 29 or the insert 28, facing away from the susceptor 2, closes the opening 15 downwards, so that, if the CVD reactor is being cleaned by the introduction of an etching gas, this can only reach the gap through the opening 15 to a reduced extent.

Figure 12:
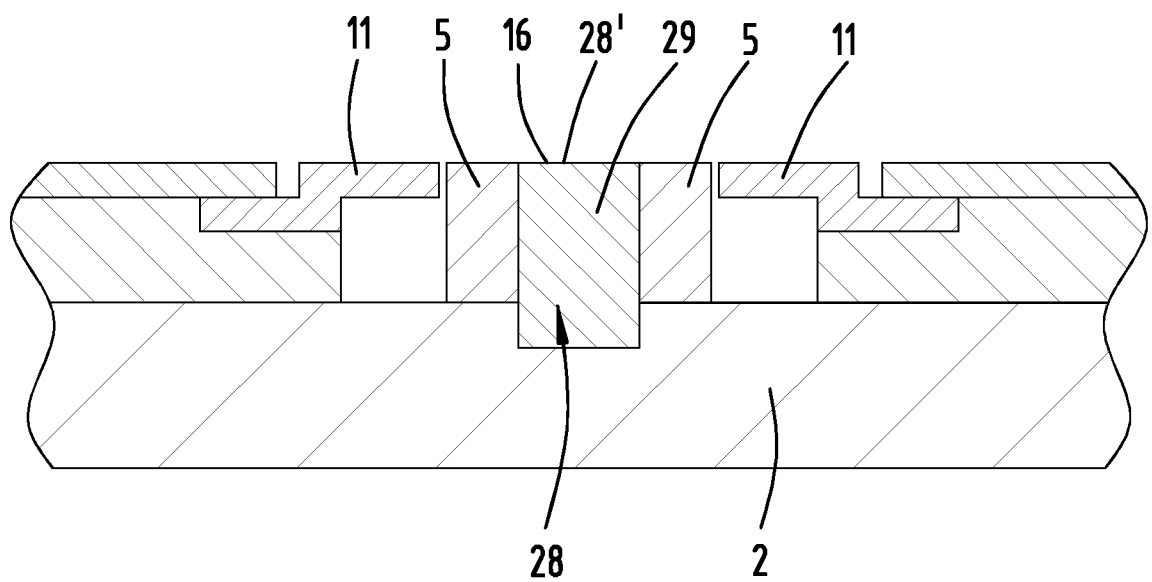
FIG. 12 shows an illustration as in FIG. 11 of a seventh example embodiment.

The seventh example embodiment illustrated in FIG. 12 shows an elevation 29, which here too is formed by an insert 28 that extends into the opening 15. The upper face of the elevation 29 or the insert 28 can lie flush with the wide face plane of the cover plate 4 or 5.

Figure 13:
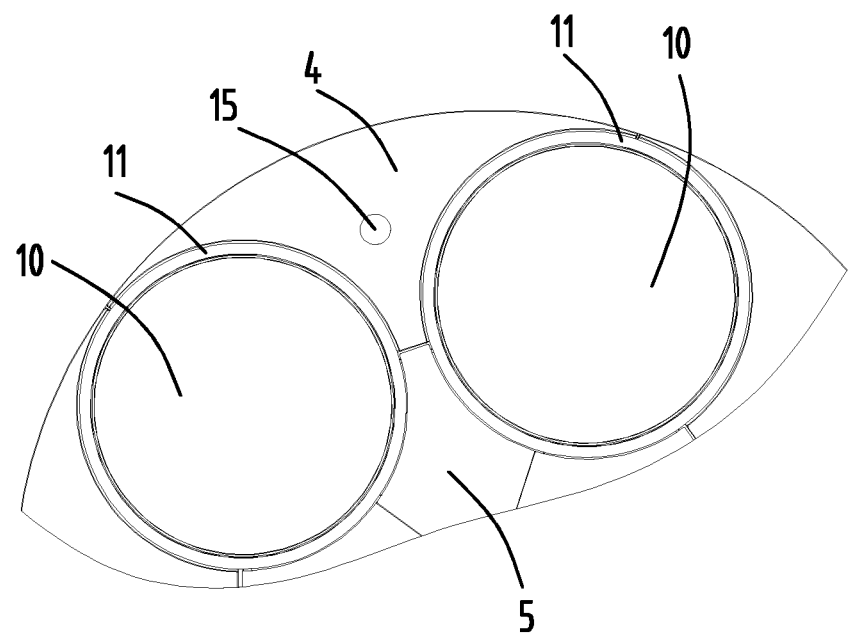
FIG. 13 shows an illustration as in FIG. 10 of an eighth example embodiment.

The eighth example embodiment illustrated in FIG. 13 shows an opening 15 in the outer cover plate 4, which here too is encircled.

Figure 6:
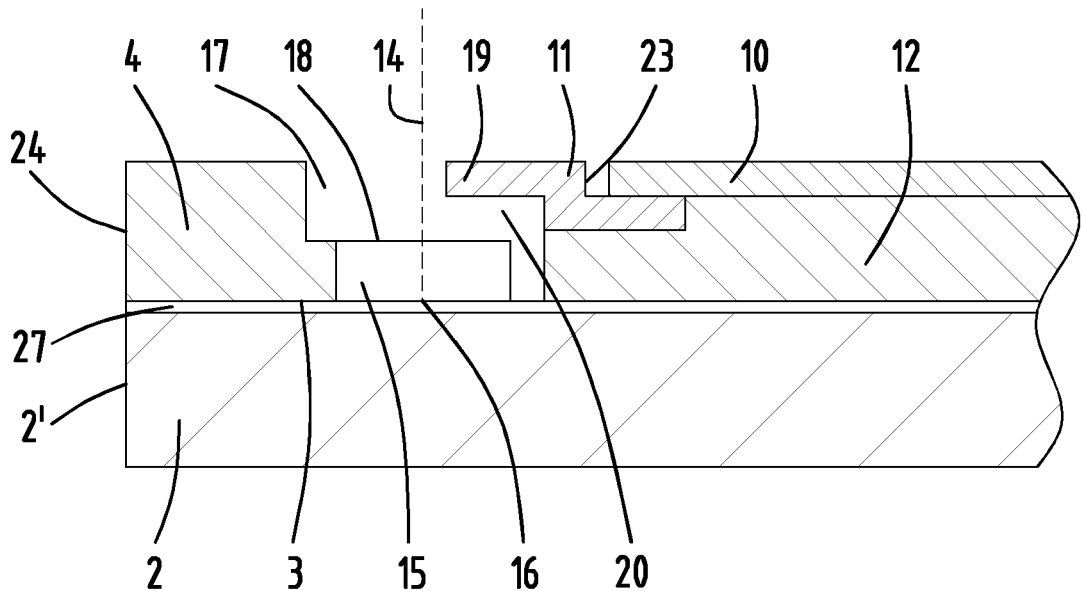
FIG. 6 shows an illustration as in FIG. 3 of a second example embodiment.

Below the opening 15, there can be a coating according to FIG. 6, a thickened coating according to FIG. 7, or an insert according to FIGS. 8, 9, 11 and 12.

The coating 27, or the insert 28 made of a resistant material, protects the surface of the susceptor 2 in the course of an etching of the CVD reactor. A defined heat transport path is formed between the lower face of the susceptor 2 and the surface 28' visible from the beam path 14, which is formed by the upper face 28' of the elevation 29, or by the coating 27, 27'.

The inserts 28 can be connected to the susceptor 2 in form fits. However, they can also be detachably inserted in a recess in the upper face 3 of the susceptor 2. They can then rest loosely to a certain extent on the susceptor.

The openings 15 can have an opening depth in the range between 6 and 8 mm. The opening width can also be between 6 and 8 mm.

Figure 16:
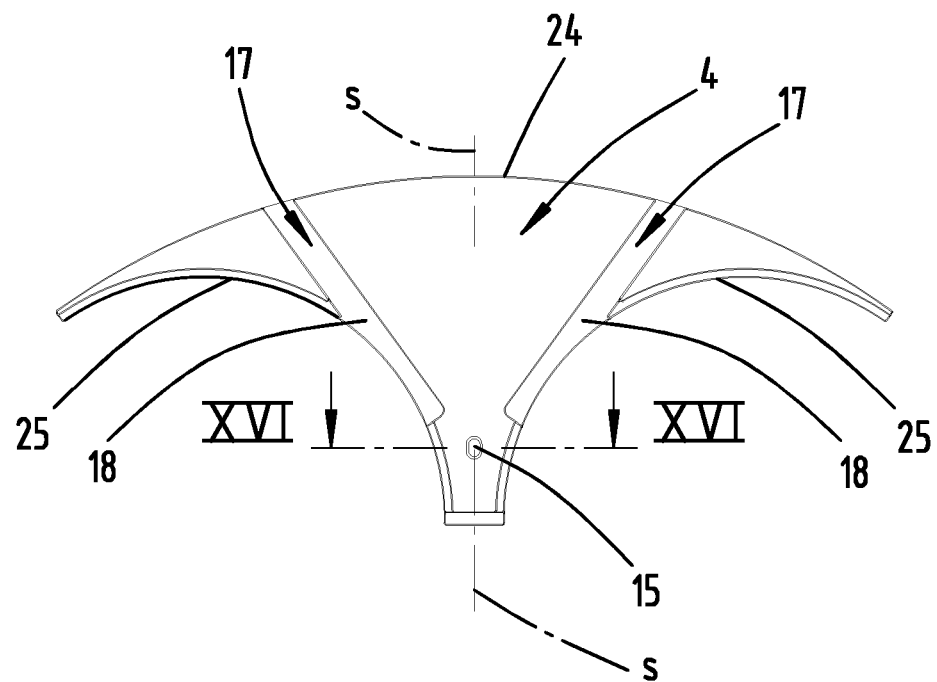
FIG. 16 shows a plan view onto the further example embodiment, in which the opening 15 extends along an axis of symmetry s.

It is also envisaged that the openings have an oval outline. Two opposing narrow sides of the opening 15 can extend along a semicircle. The diameter of the semicircle can be in the range between 4 and 7 mm. It is preferably 5 mm. The vertices of the two semicircles can be spaced apart by 6-10 mm, wherein a value between 8 and 9 mm is preferred. FIGS. 14 to 16 show an example of such example embodiment. Here, they take the form of segment-shaped cover plates 4, which are designed such that a plurality of such cover plates 4 can be joined together to form a circle. Circular free spaces 30 are then formed, which serve to store a substrate. The cover plates 4 illustrated in FIGS. 14 to 16 have an axis of symmetry S. The axis of symmetry S runs centrally between two circular arc-shaped edges 25. The cover plates 4, which complement each other to form a circle, surround with their inner edges 25 circular storage areas, the centers of which run along a circular arc line. The opening 15 is located on an imaginary circular-arc-shaped surface, which extends over the centers of the storage areas. Within this narrow circular arc-shaped strip are located the openings 15. This area is bounded by the lines "a" and "b" in FIG. 1.

Figure 17:
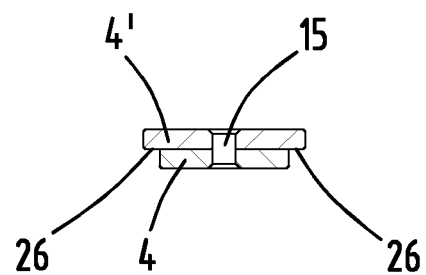
FIG. 17 shows a cross-section along the line XVI-XVI in FIG. 16.

The cover plates 4 can be configured in one piece. However, it is also envisaged, as illustrated in particular in FIG. 17, that a plurality of cover plates 4, 4' can be arranged in a sandwich-like manner one above the other.

The functionality of the device is as follows:

The heating entity 9 is used to heat the susceptor 2 to a susceptor temperature. This is selected such that the surface of the substrate 10 assumes a process-specific substrate temperature.

The susceptor 2 and the substrate holders 12 are rotationally driven about their respective figure axes.

The process gases described above are fed through the gas inlet element 8 into the process chamber 7, such that they decompose there pyrolytically, and in particular on the surface of the substrate 10. The decomposition products are, for example, gallium and nitrogen. These decomposition products form a layer on the surface of the substrate 10.

During the deposition of the layer, the substrate temperature is measured optically with an optical measuring device, for example with a pyrometer 13. The relevant optical beam path 14 runs from the pyrometer 13 parallel to the axis of rotation 22 through an opening 21 in the process chamber ceiling 6. In addition, the beam path 14 passes through the opening 15 in the outer cover plate 4, so that, at a measuring point 16 on the upper face 3 of the susceptor 2, the surface temperature of the susceptor 2 can be measured optically. By means of a control entity (not illustrated), the temperature value measured at the measuring point 16 can be used to supply the heating device 9 with heating power so as to control the susceptor temperature to a setpoint value.

The optical measuring device 13 can also be used to measure the surface temperature of the substrate 10. If this can be measured, the substrate temperature can also be used for control purposes.

The above statements serve to explain the inventions covered by the application as a whole, which independently develop the prior art at least through the following combinations of features, wherein two, a plurality, or all of these combinations of features can also be combined, namely:

A device, which is characterized in that at least one cover plate 4, 5 has an opening 15, through which a section of the upper face 3 of the susceptor 2 is visible, and through which the temperature measurement is made.

A susceptor arrangement for a device, having a susceptor and cover plates 4, 5, characterized in that the opening 15 is located in the annular surface.

A cover plate, which is characterized in that the opening 15 is arranged in the region of the annular surface.

A device, which is characterized in that the opening 15 is open towards an edge 25 of the cover plate 4, and/or in that the opening 15 is located closer to a circular arc line 10, which extends through the centers of circular surfaces, which are at least partially enclosed by an edge 25 of the cover plate 4, than to a circular arc line "a", which is tangential to the circular surfaces radially outwards, or to a circular arc line "b", which is tangential to the circular surfaces radially inwards.

A device, which is characterized in that the cover plate 4 has a circular peripheral edge, or is a segment of a body having a circular peripheral edge, wherein the cover plate has an inner edge 25 extending along a circular arc line, and the opening 15 is arranged between two inner edges 25, or adjacent to an inner edge 25.

A device, which is characterized in that the area of the opening (5) is maximum of 100 mm$^2$, preferably a maximum of 80 mm$^2$, or a maximum of 60 mm$^2$.

A device, which is characterized in that the cover plate 4 has a channel 17 open towards the process chamber 7, the floor 18 of which forms the opening 15, and/or in that the cover plate 4 is adjacent to an outer edge 2' of the susceptor 2.

A device, which is characterized in that the means for measuring the temperature of the susceptor 2 comprise a pyrometer 13 arranged above a process chamber ceiling 6, wherein a beam path 14 passes through the opening 15 and an opening 21 arranged above it in the process chamber ceiling 6.

A device, which is characterized in that along an edge 2' of the circular disk-shaped susceptor 2 is arranged a plurality of cover plates 4, each of which has an inner edge 25, which is adjacent to an edge of a substrate 10, of a supporting ring 11, or of a substrate holder 12, wherein in particular provision is made for the plurality of cover plates 4 to form parallel channels 17 in pairs, which are open towards the radially outer edge 24 of the cover plate 4, and which run in a tangential direction to the substrates 10.

A device, which is characterized in that the section of the upper face visible through the opening 15 has a coating 27, which is formed by an elevation 29, or is formed by an insert 28 inserted in a recess of the susceptor 2, wherein an end face 28' of the insert 28, or of the elevation 29, is flush with the upper face 3, or projects beyond the upper face 3, wherein in particular provision is made for a lower face 5' of a cover plate 5 in the region of the opening 15 to be supported on an elevation 19, which closes the opening 15, and/or in that a cover plate 4, 5 forms a window in which the substrate 10 rests.

All disclosed features are (individually, but also in combination with each other) essential to the invention. The disclosure of the application hereby also fully includes the disclosure content of the associated/accompanying priority documents (copy of the previous application), also for the purpose of including features of these documents in claims of the present application. The subordinate claims with their features characterize, also without the features of a claim to which reference is made, independent inventive developments of the prior art, in particular in order to make divisional applications on the basis of these claims. The invention specified in each claim can in addition have one or a plurality of the features specified in the above description, in particular those provided with reference numbers and/or specified in the list of reference numbers. The invention also relates to forms of design in which some of the features cited in the above description are not implemented, in particular to the extent that they are recognizably unnecessary for the respective purpose of use, or can be replaced by other means having the same technical effect.

LIST OF REFERENCE SYMBOLS

1 CVD reactor 25 Inner edge
2 Susceptor 26 Step
2 'Edge 27 Coating
3 Upper face 27' Coating
4 Outer cover plate 28 Insert
4 'Cover plate 28' Surface
5 Inner cover plate 29 Elevation
5' Lower face
6 Process chamber ceiling a Circular line
7 Process chamber b Circular line
8 Gas inlet C Circular line
9 Heating entity
10 Substrate d Opening width
11 Supporting ring e Distance
12 Substrate holder f Channel width 13 Pyrometer
14 Beam path S Axis of symmetry
15 Opening
16 Measuring point
17 Channel
18 Floor
19 Projection
20 Free space
21 Opening
22 Axis of rotation
23 Supporting shoulder
24 Outer edge
30 Free spaces

What is claimed is:

1. A susceptor arrangement for depositing layers on substrates (10), the susceptor arrangement comprising:
a susceptor (2); and
cover plates (4, 5) arranged on an upper face (3) of the susceptor (2),
wherein first free spaces (30) between the cover plates (4, 5) are configured for arranging the substrates (10) on an annular surface bounded by two circles (a, b) around a center of the susceptor arrangement,
wherein a first one of the cover plates (4, 5) has an opening (15) that connects a top wide face of the first cover plate (4, 5) to a bottom wide face of the first cover plate (4, 5), through which a section of the upper face (3) of the susceptor (2) is visible to a pyrometer (13),
wherein the opening (15), with a maximum area of 100 mm², is located in the annular surface,
wherein the first cover plate (4, 5) forms at least one circular arc-shaped edge to which a corresponding one of the substrates (10) is located adjacent to, and
wherein the opening (15) forms a cut that opens toward an edge (25) of the first cover plate (4, 5), the susceptor arrangement further comprising:
a first channel (17) of the first cover plate (4, 5) having a floor (18) spaced apart from an upper face of the first cover plate (4, 5) facing towards a process chamber (7);
a supporting ring (11) with a radially outer projection (19);
a circular disc-shaped substrate holder (12) disposed in one of the first free spaces (30), the circular disc-shaped substrate holder (12) carrying the supporting ring (11); and
a second free space (20) extending between the floor (18) of the first channel (17) and a lower face of the radially outer projection (19), the second free space (20) disposed proximal to the opening (15).

2. The susceptor arrangement of claim 1, wherein at least one of:
the first cover plate (4, 5) has a peripheral edge running along a circular arc line, or
the cover plates (4, 5) are identical to one another and are arranged in a circular shape, such that their respective outer edges, running along circular arcs, complement each other to form a complete circle, within which is arranged the annular surface.

3. The susceptor arrangement of claim 1, wherein the opening (15) lies closer to a first circular arc line (c), which runs through respective centers of circular surfaces, which are at least partially enclosed by the edge (25) of the first cover plate (4, 5), than to a second circular arc line (a), which is tangential to respective radially outward edges of the circular surfaces, or to a third circular arc line (b), which is tangential to respective radially inward edges of the circular surfaces.

4. The susceptor arrangement of claim 1, wherein the first cover plate (4, 5) has a circular peripheral edge, or is a segment of a body having a circular peripheral edge.

5. The susceptor arrangement of claim 1, wherein the maximum area of the opening (15) is 80 mm².

6. The susceptor arrangement of claim 1, wherein the opening (15) is located through the floor (18) of the first channel (17).

7. The susceptor arrangement of claim 1, wherein the first cover plate (4, 5) is arranged adjacent to an outer edge (2') of the susceptor (2).

8. The susceptor arrangement of claim 1, wherein the cover plates (4, 5) are arranged along an edge (2') of the susceptor (2), and wherein the susceptor (2) is circular disk-shaped.

9. The susceptor arrangement of claim 1, wherein the first cover plate (4, 5) further comprises a second channel (17), the first and second channels (17) forming a pair of channels (17) that are parallel to one another, and wherein the pair of channels (17) opens toward a radially outer edge (24) of the first cover plate (4, 5), and each of the first and second channels (17) extend in a direction tangential to an edge of a corresponding one of the substrates (10).

10. The susceptor arrangement of claim 1,
wherein the section of the upper face (3) that is visible through the opening (15) has a coating (27), is formed by an elevation (29), or is formed by an insert (28) inserted in a recess of the susceptor (2), and
wherein an end face (28') of the insert (28) or the elevation (29) lies flush with the upper face (3), or projects beyond the upper face (3).

11. The susceptor arrangement of claim 1, wherein the section of the upper face (3) of the susceptor (2) that is visible through the opening (15) is formed from an upper face (28') of an elevation (29), and wherein a lower face (5') of the first cover plate (5) in a region of the opening (15) is supported on the elevation (29).

12. An apparatus for the deposition of layers containing group-III and group-V elements on a substrate (10), the apparatus comprising:
a process chamber (7) with a process chamber ceiling (6);
a susceptor (2) with a face (3) that faces toward the process chamber (7);
at least one cover plate (4, 5) supported by the susceptor (2), wherein an edge (2') of the substrate (10) is arranged adjacent to the at least one cover plate (4, 5); and
means (13, 14, 15, 21) for optically measuring a temperature of the susceptor (2) through an opening (21) in the process chamber ceiling (6),
wherein the at least one cover plate (4, 5) has an opening (15) with a maximum area of 100 mm², through which a section of the face (3) of the susceptor (2) is visible to the means (13, 14, 15, 21) for optically measuring the temperature of the susceptor (2), and through which the optical measurement of the temperature of the susceptor (2) is performed,
wherein the substrate (10) is arranged on an annular surface of the susceptor (2) bounded by two circles (a, b) around a center of the susceptor (2), and
wherein the opening (15) is located in the annular surface.

13. The apparatus of claim 12, wherein the means for optically measuring the temperature of the susceptor (2) comprises a pyrometer (13) arranged above the process chamber ceiling (6), and wherein a beam path (14) of the pyrometer (13) passes through the opening (21) in the process chamber ceiling (6) and the opening (15) in the at least one cover plate (4, 5).

14. The apparatus of claim 12,
wherein the opening (15) forms a cut that opens toward an edge (25) of the at least one cover plate (4, 5),
wherein a first free space (30) between the at least one cover plate (4, 5) is configured for arranging the substrate (10), the apparatus further comprising:
a channel (17) having a floor (18) spaced apart from an upper face of the at least one cover plate (4, 5) facing towards a process chamber (7);
a supporting ring (11) with a radially outer projection (19);
a circular disc-shaped substrate holder (12) disposed in the first free space (30), the circular disc-shaped substrate holder (12) carrying the supporting ring (11); and
a second free space (20) extending between the floor (18) of the channel (17) and a lower face of the radially outer projection (19), the second free space (20) disposed proximal to the opening (15).

* * * * *